(12) United States Patent
Yamagishi et al.

(10) Patent No.: US 10,867,819 B2
(45) Date of Patent: Dec. 15, 2020

(54) VACUUM PROCESSING APPARATUS, VACUUM PROCESSING SYSTEM AND VACUUM PROCESSING METHOD

(71) Applicant: TOKYO ELECTRON LIMITED, Tokyo (JP)

(72) Inventors: Takayuki Yamagishi, Tokyo (JP); Tamihiro Kobayashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/438,781

(22) Filed: Jun. 12, 2019

(65) Prior Publication Data

US 2019/0385873 A1 Dec. 19, 2019

(30) Foreign Application Priority Data

Jun. 15, 2018 (JP) .................. 2018-114701

(51) Int. Cl.
| | | |
|---|---|---|
| *H01L 21/67* | (2006.01) | |
| *C23C 16/455* | (2006.01) | |
| *C23C 16/44* | (2006.01) | |
| *C23C 16/54* | (2006.01) | |
| *H01L 21/677* | (2006.01) | |

(52) U.S. Cl.
CPC .... *H01L 21/67184* (2013.01); *C23C 16/4412* (2013.01); *C23C 16/455* (2013.01); *C23C 16/54* (2013.01); *H01L 21/67017* (2013.01); *H01L 21/67739* (2013.01)

(58) Field of Classification Search
CPC ............. H01L 21/0228; H01L 21/0262; H01L 21/28556
See application file for complete search history.

(56) References Cited

U.S. PATENT DOCUMENTS

| | | | | |
|---|---|---|---|---|
| 2002/0020355 A1* | 2/2002 | Saeki | ............... | H01L 21/67745 118/719 |
| 2011/0238201 A1* | 9/2011 | Hiroki | ............... | H01L 21/67196 700/112 |
| 2012/0148375 A1* | 6/2012 | Tashiro | ............. | H01L 21/67173 414/217 |
| 2013/0302115 A1* | 11/2013 | Wakabayashi | .... | H01L 21/67196 414/217 |
| 2017/0029948 A1 | 2/2017 | Jongbloed et al. | | |

FOREIGN PATENT DOCUMENTS

JP 2017-199735 A 11/2017

* cited by examiner

*Primary Examiner* — Jaehwan Oh
(74) *Attorney, Agent, or Firm* — Nath, Goldberg & Meyer; Jerald L. Meyer

(57) ABSTRACT

There is provided a vacuum processing apparatus for performing a vacuum process by supplying a processing gas onto a substrate arranged in a processing space kept in a vacuum atmosphere, the apparatus comprising: a first transfer space and a second transfer space in each of which the substrate is transferred; and an intermediate wall portion provided between the first transfer space and the second transfer space along the extension direction, wherein one or more processing spaces are arranged in the first transfer space along the extension direction, and two or more processing spaces are arranged in the second transfer space along the extension direction, and wherein a plurality of exhaust paths and a joined exhaust path where the plurality of exhaust paths are joined are formed in the intermediate wall portion.

10 Claims, 9 Drawing Sheets

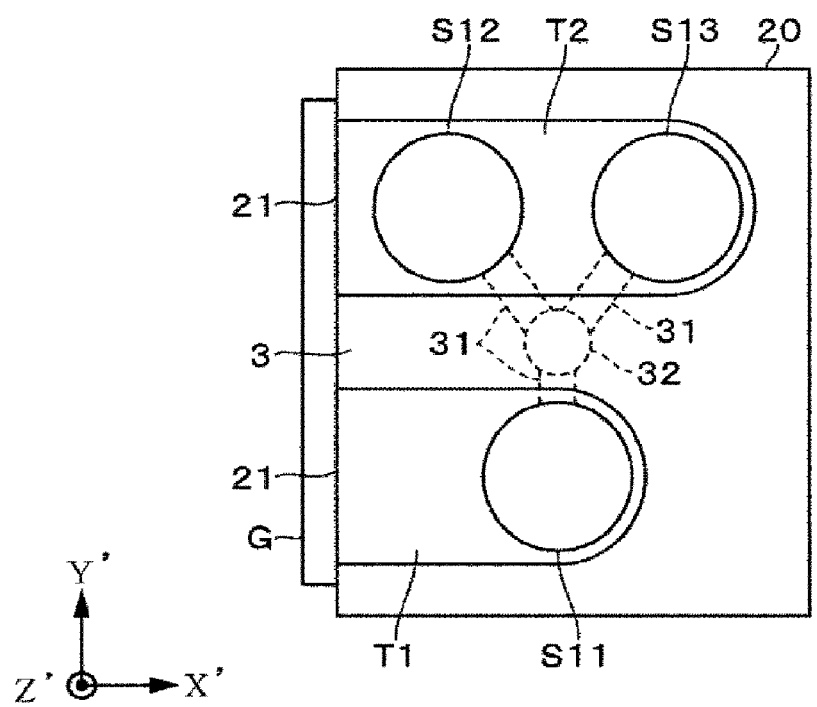

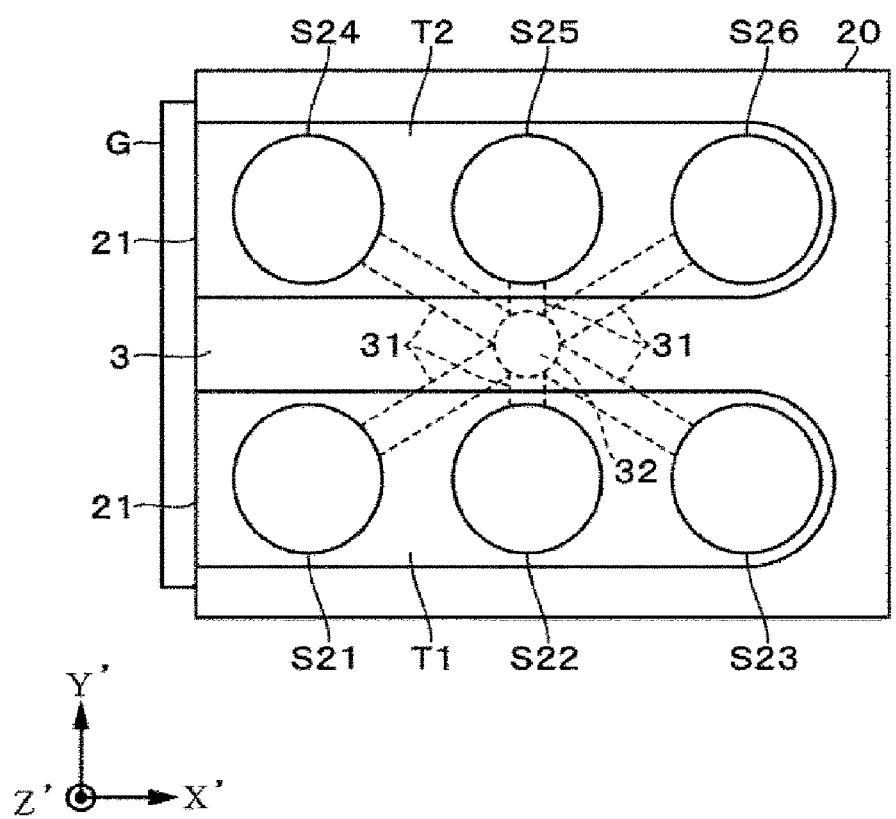

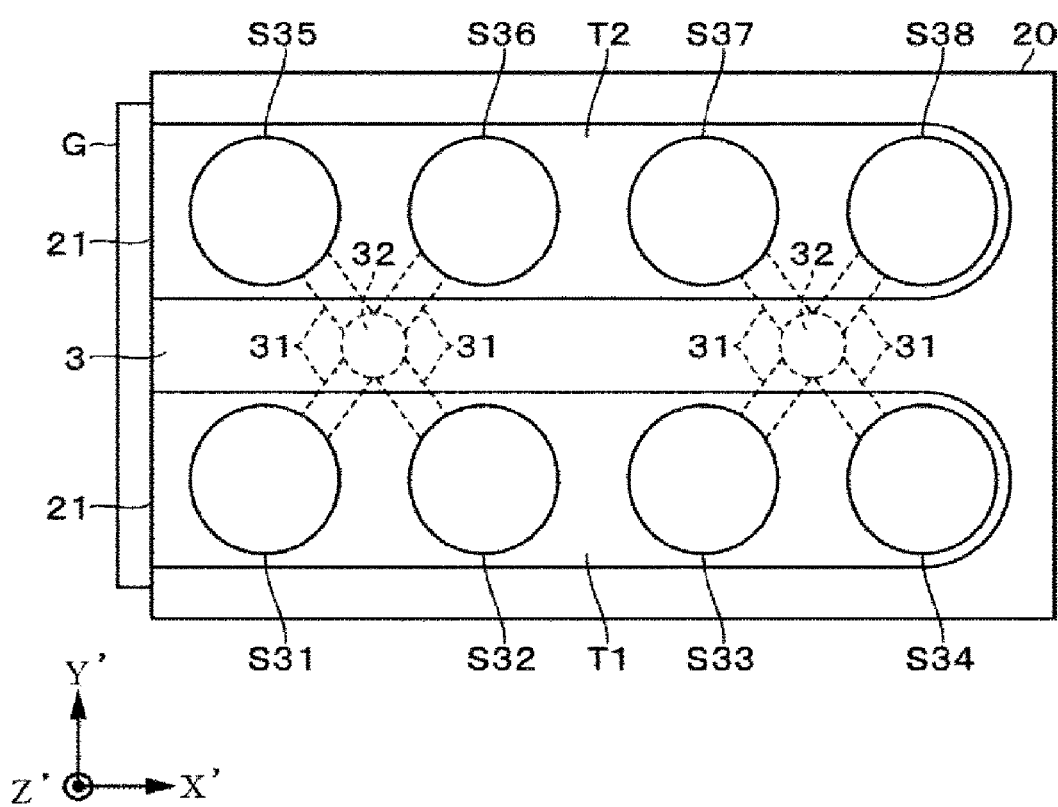

US 10,867,819 B2

VACUUM PROCESSING APPARATUS, VACUUM PROCESSING SYSTEM AND VACUUM PROCESSING METHOD

CROSS-REFERENCE TO RELATED APPLICATION

This application is based upon and claims the benefit of priority from Japanese Patent Application No. 2018-114701, filed on Jun. 15, 2018, the entire contents of which are incorporated herein by reference.

TECHNICAL FIELD

The present disclosure relates to a vacuum processing apparatus, a vacuum processing system and a vacuum processing method.

BACKGROUND

In a process of manufacturing a semiconductor device, various processes such as etching, film formation and the like are performed in a vacuum atmosphere on a semiconductor wafer (hereinafter referred simply to as a wafer) which is a substrate. As a vacuum processing apparatus that performs such vacuum processing on the substrate, a configuration in which four substrate processing parts are circumferentially arranged at equal intervals in a vacuum container is known. A wafer transfer mechanism is installed in the center of the vacuum container. An internal atmosphere of the vacuum container is evacuated through an exhaust port formed in the bottom surface of the outer peripheral portion of the vacuum container.

SUMMARY

Some embodiments of the present disclosure provide a technique advantageous for miniaturization and simplification of a vacuum processing apparatus.

According to one embodiment of the present disclosure, there is provided a vacuum processing apparatus for performing a vacuum process by supplying a processing gas onto a substrate arranged in a processing space kept in a vacuum atmosphere, the apparatus including: a first transfer space and a second transfer space in each of which the substrate is transferred, the first transfer space and the second transfer space being provided at adjacent positions inside a processing container in which the vacuum process is performed, each of the first transfer space and the second transfer space being provided to extend horizontally from a loading/unloading port formed in a side surface of the processing container; and an intermediate wall portion provided between the first transfer space and the second transfer space along the extension direction, wherein one or more processing spaces are arranged in the first transfer space along the extension direction, and two or more processing spaces are arranged in the second transfer space along the extension direction, and wherein a plurality of exhaust paths, which are provided respectively for three or more processing spaces with the intermediate wall portion interposed therebetween, and a joined exhaust path where the plurality of exhaust paths are joined are formed in the intermediate wall portion.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7A is a plan view for explaining a first modification of the vacuum processing apparatus of the present disclosure.

FIG. 7B is a plan view for explaining a second modification of the vacuum processing apparatus of the present disclosure.

FIG. 7C is a plan view for explaining a third modification of the vacuum processing apparatus of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
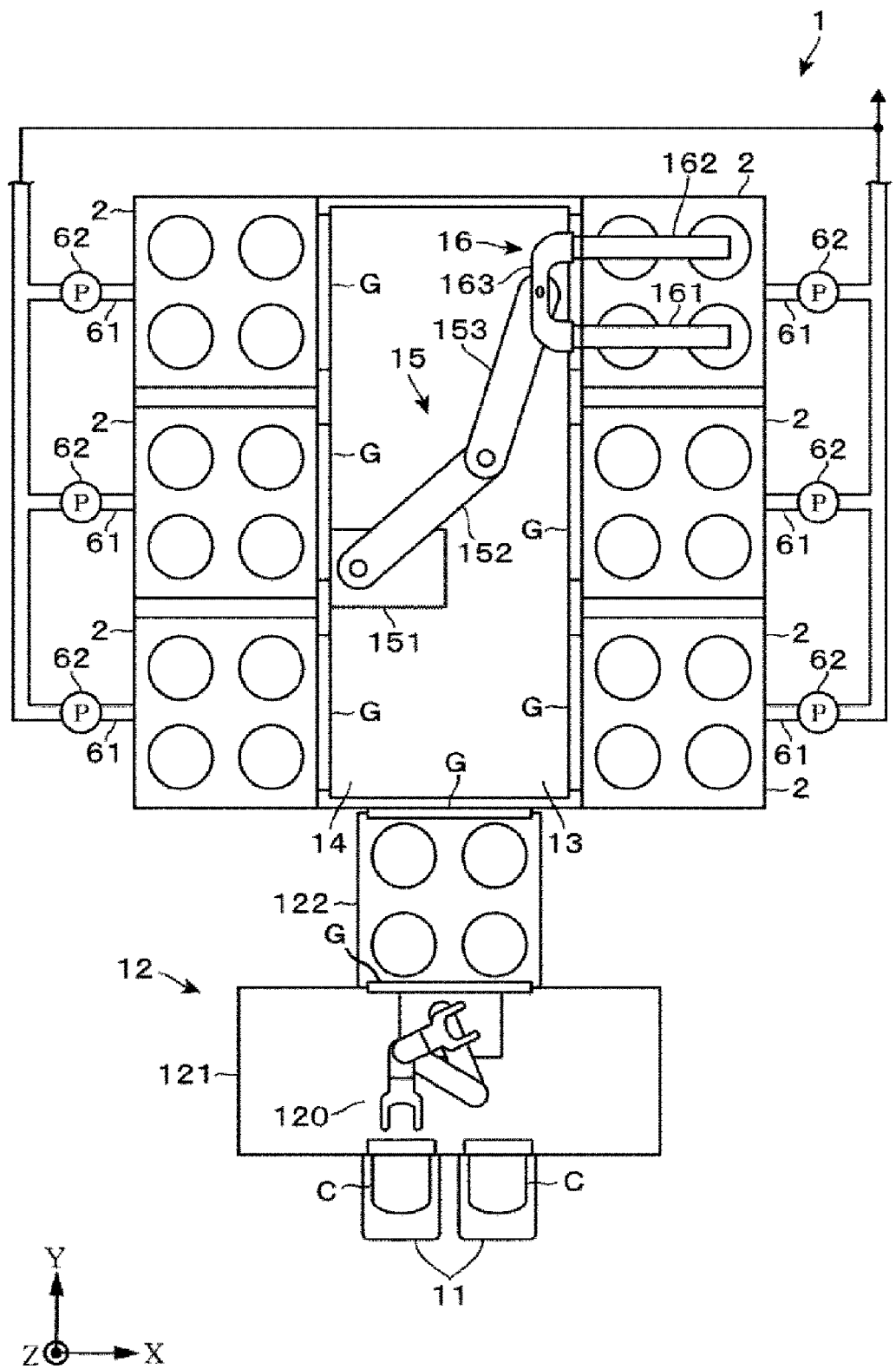
FIG. 1 is a plan view for explaining a configuration of a vacuum processing system according to an embodiment of the present disclosure.

A vacuum processing system 1 according to an embodiment of the present disclosure will be described with reference to a plan view of FIG. 1. The vacuum processing system 1 includes a loading/unloading port 11, a loading/unloading module 12, a vacuum transfer module 13 and vacuum processing apparatuses 2. In FIG. 1, it is assumed that the X-direction is the left-right direction, the Y-direction is the front-rear direction, and the loading/unloading port 11 is located at the front side in the front-rear direction. The loading/unloading port 11 is provided at the front side of the loading/unloading module 12 in the front-rear direction. The vacuum transfer module 13 is provided at the rear side of the loading/unloading module 12 in the front-rear direction.

A carrier used as a transfer container in which a substrate to be processed is accommodated is placed on the loading/unloading port 11. For example, the substrate is a wafer W which is a circular substrate having a diameter of, for example, 300 mm. The loading/unloading module 12 is a module for loading/unloading the wafer W between the carrier C and the vacuum transfer module 13. The loading/unloading module 12 includes a normal pressure transfer chamber 121 in which the wafer W is loaded into and unloaded from the carrier C in a normal pressure atmosphere by a transfer mechanism 120, and a load lock chamber 122 in which an atmosphere in which the wafer W is placed is changed between the normal pressure atmosphere and the vacuum atmosphere.

The vacuum transfer module 13 includes a vacuum transfer chamber 14 whose interior is in a vacuum atmosphere. A substrate transfer mechanism 15 is disposed inside the vacuum transfer chamber 14. The vacuum transfer chamber 14 is formed in, for example, a rectangular shape having a long side in a direction along the front-rear direction when viewed from the top. A plurality of (for example, three) vacuum processing apparatuses 2 is connected to two sidewalls corresponding to the long sides in four sidewalls of the rectangular vacuum transfer chamber 14, respectively. A short side of the rectangular vacuum transfer chamber 14 at the front side in the front-rear direction is connected to the load lock chamber 122 provided in the loading/unloading module 12. In FIG. 1, symbols G denote gate valves provided between the normal pressure transfer chamber 121 and the load lock chamber 122, between the load lock chamber 122 and the vacuum transfer module 13, and between the vacuum transfer module 13 and the vacuum processing apparatuses 2, respectively. Each of the gate valves G opens or closes a loading/unloading port formed in each of the modules connected to each other and through which the wafer W is transferred.

The substrate transfer mechanism 15 is to transfer the wafer W between the loading/unloading module 12 and the vacuum processing apparatuses 2 in a vacuum atmosphere and includes a substrate holder 16 having an articulated arm for holding the wafer W. Each of the vacuum processing apparatuses 2 in this embodiment performs gas processing in a collective manner with respect to a plurality of (for example, four) wafers W in a vacuum atmosphere, as will be described later. To do this, the substrate holder 16 of the substrate transfer mechanism 15 is configured to hold, for example, four wafers W so as to transfer the four wafers W to the respective vacuum processing apparatus 2 in a collective manner.

Specifically, the substrate transfer mechanism 15 includes, for example, a base 151, a horizontally-extending first arm 152, a horizontally-extending first arm 153 and the substrate holder 16. The first arm 152 has a proximal end portion fixed on the base 151 and swings around a vertical axis on the base 151. The second arm 153 has a proximal end portion fixed on a distal end portion of the first arm 152 and swings around a vertical axis on the distal end portion of the first arm 152. The substrate holder 16 includes a first substrate holding part 161, a second substrate holding part 162 and a connection portion 163. Each of the first substrate holding part 161 and the second substrate holding part 162 is formed in an elongated spatula shape. The first substrate holding part 161 and the second substrate holding part 162 extend in a horizontally spaced-apart parallel relationship with each other. The connection portion 163 extends horizontally so as to be perpendicular to the extension direction of the first and second substrate holding parts 161 and 162, and connects between proximal end portions of the first and second substrate holding parts 161 and 162. The central portion of the connection portion 163 in a longitudinal direction is located on the distal end portion of the second arm 153 and swings around a vertical axis on the distal end portion of the second arm 153. The first substrate holding part 161 and the second substrate holding part 162 will be described in more detail later.

Figure 2:
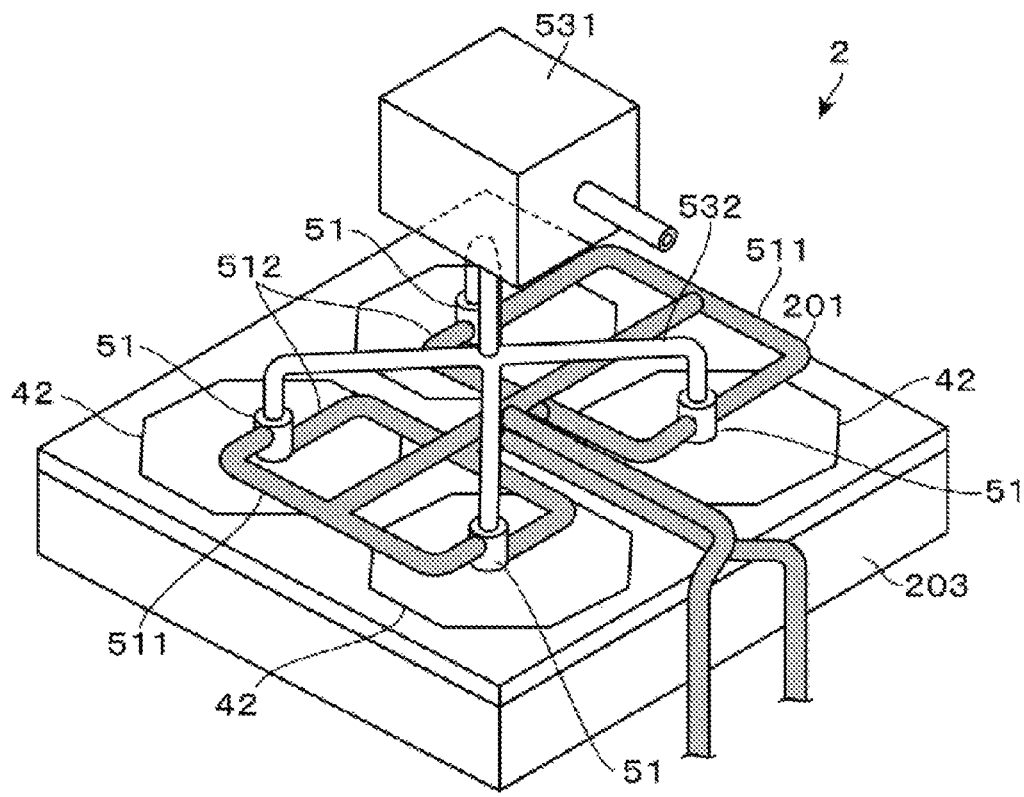
FIG. 2 is an exploded perspective view for explaining an example of a configuration of a vacuum processing apparatus provided in the vacuum processing system.
Figure 2:
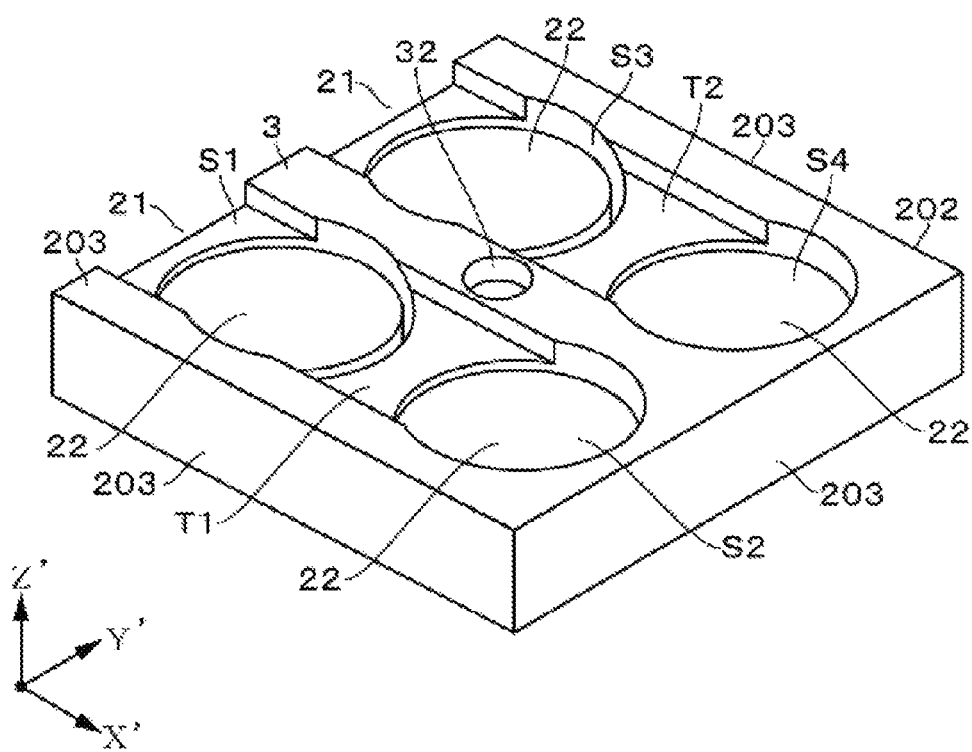

Next, an example in which the vacuum processing apparatus 2 is applied to, for example, a film forming apparatus for performing a plasma-based CVD (Chemical Vapor Deposition) process on the wafer W will be described with reference to FIGS. 2 to 4. FIG. 2 is an exploded perspective view for explaining the configuration of the vacuum processing apparatus 2, FIG. 3 is a plan view schematically showing a processing space formed in the vacuum processing apparatus 2, and FIG. 4 is a longitudinal cross-sectional view of the vacuum processing apparatus 2 taken along line A-A in FIG. 3.

Six vacuum processing apparatuses 2 are similar to each other in configuration and are configured to simultaneously perform respective processes on the wafers W in parallel. Each the processing apparatuses 2 includes a processing container (vacuum container) 20 of a rectangular shape when viewed from the top. In FIGS. 2 and 4, reference numeral 201 denotes a ceiling member of the processing container 20 and reference numeral 202 denotes a container body. The processing container 20 has, for example, four sidewall portions 203 surrounding the periphery of the processing container 20. Among the four sidewall portions 203, the sidewall portion 203 connected to the vacuum transfer chamber 14 has two loading/unloading ports 21 formed to be arranged in the front-rear direction (Y'-direction in FIG. 2). The loading/unloading ports 21 are opened/closed by the respective gate valve G.

Figure 3:
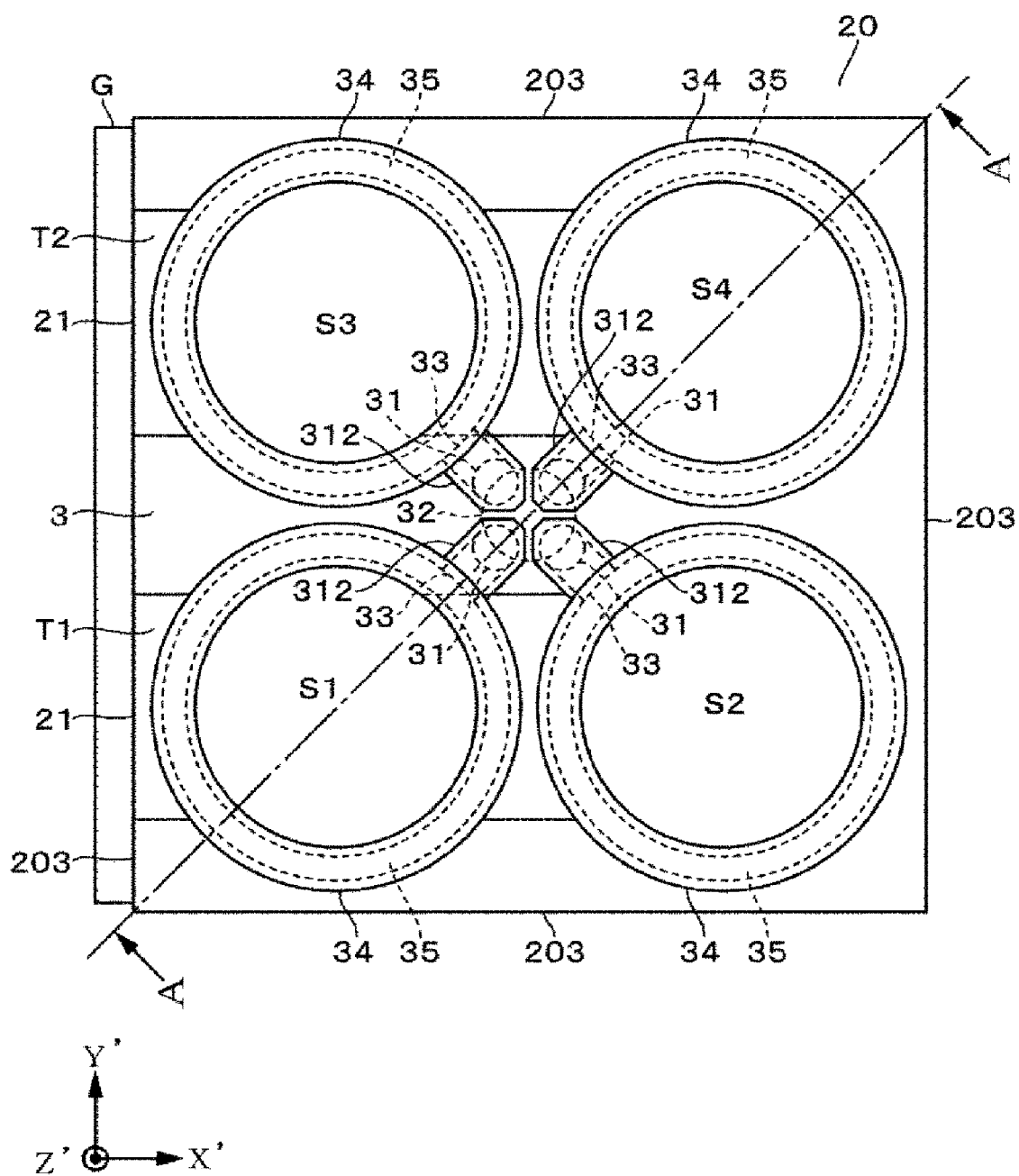
FIG. 3 is a schematic plan view for explaining the configuration of the vacuum processing apparatus.
Figure 4:
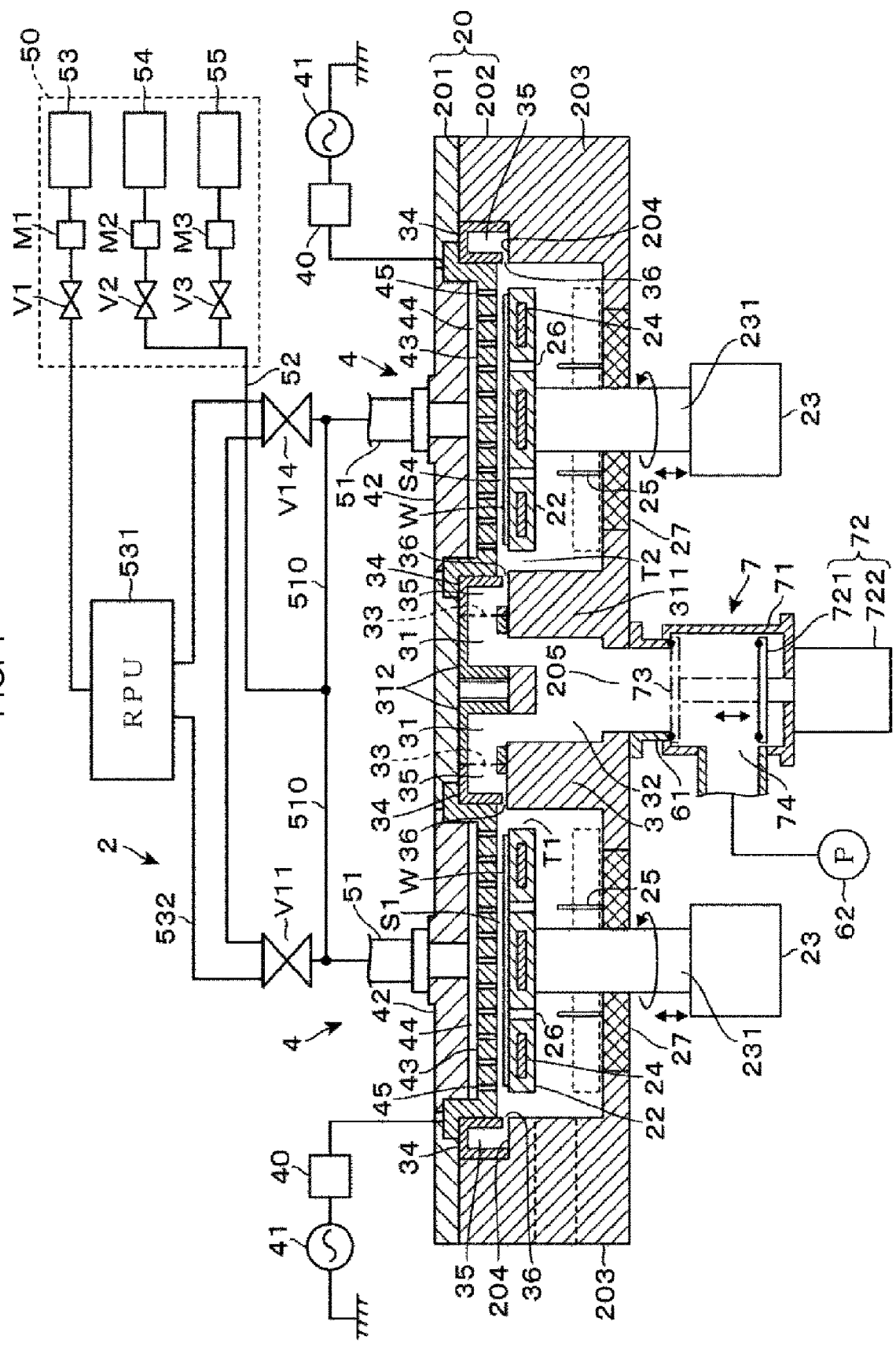
FIG. 4 is a longitudinal cross-sectional view for explaining the configuration of the vacuum processing apparatus.

As shown in FIGS. 2 and 3, a first transfer space T1 and a second transfer space T2 through which the wafers W are respectively transferred are formed adjacent to each other in the interior of the processing container 20. The first transfer space T1 and the second transfer space T2 extend in a horizontal direction from the respective loading/unloading ports 21. In addition, an intermediate wall portion 3 is formed along an extension direction (X'-direction in FIG. 2) between the first transfer space T1 and the second transfer space T2 in the processing container 20. Two processing spaces S1 and S2 are arranged along the extension direction in the first transfer space T1, and two processing spaces S3 and S4 are arranged along the extension direction in the second transfer space T2. Therefore, in the processing container 20, a total of four processing spaces S1 to S4 is arranged in the form of a matrix of 2 rows×2 columns when viewed from the top. The term "horizontal direction" used herein includes a case where the first transfer space T1 and the second transfer space T2 are slightly inclined in the extension direction due to the influence of a manufacturing tolerance or the like unless devices are not brought into contact with each other at the time of loading/unloading the wafers W.

An internal structure of the processing container 20 including the processing spaces S1 to S4 will be described with reference to FIG. 4. The four processing spaces S1 to S4 are similar to each other in configuration. Each of the four processing spaces S1 to S4 is formed between a mounting table 22 on which the wafer W is mounted and a gas supply part 4 disposed to face the mounting table 22. In FIG. 4, the processing space S1 of the first transfer space T1 and the processing space S4 of the second transfer space T2 are shown. Hereinafter, the processing space S1 will be described as an example.

The mounting table 22 serving also as a lower electrode is formed in a flat cylindrical shape and is made of metal or aluminum nitride (AlN) embedded therein with a metal mesh electrode. The mounting table 22 is configured to be moved up/down and rotated around a vertical axis through a driving shaft 231 by a drive mechanism 23 serving also as a rotation mechanism. In FIG. 4, a solid line applied to the mounting table 22 represents a case where the mounting table 22 is positioned at a processing position, and a dotted line drawn below the solid line represents a case where the mounting table 22 is positioned at a delivery position. The processing position refers to a position at which a vacuum process (film-forming process) to be described later is performed. The delivery position refers to a position at which the wafer W is transferred with respect to the aforementioned substrate transfer mechanism 15. In FIG. 4, reference numeral 24 denotes a heater embedded in the mounting table 22. The heater 24 heats the wafer W mounted on the mounting table 22 to about 60 degrees C. to 600 degrees C. In addition, the mounting table 22 is connected to a ground potential.

Further, a plurality of (for example, three) delivery pins 25 is provided in the bottom surface of the processing container 20 at positions corresponding to the mounting table 22. Through-holes 26 through which the respective delivery pins 25 pass are formed in the mounting table 22. When the mounting table 22 is lowered to the delivery position, the delivery pins 25 pass through the respective through-holes 26 such that tips of the delivery pins 25 protrude from a mounting surface of the mounting table 22. The shape of the first and second substrate holding parts 161 and 162 of the substrate transfer mechanism 15 and the arrangement of the delivery pins 25 are set to prevent the delivery pins 25 from interfering with the first and second substrate holding parts 161 and 162 when delivering the wafers W.

The first and second substrate holding parts 161 and 162 will be described. The first substrate holding part 161 is configured to hold the wafers W at positions corresponding to the arrangement positions at which the processing spaces S1 and S2 are arranged in the first transfer space T1 when the first substrate holding part 161 has entered the first transfer space T1. The positions corresponding to the arrangement positions at which the processing spaces S1 and S2 are arranged in the first transfer space T1 refer to positions set to deliver the wafers W to two mounting tables 22 provided respectively in the processing space S1 and S2 of the first transfer space T1. The second substrate holding part 162 is configured to hold the wafers W at positions corresponding to the arrangement positions at which the processing spaces S3 and S4 are arranged in the second transfer space T2 when the second substrate holding part 162 has entered the second transfer space T2. The positions corresponding to the arrangement positions at which the processing spaces S3 and S4 are arranged in the second transfer space T2 refer to positions set to deliver the wafers W to two mounting tables 22 provided respectively in the processing space S3 and S4 of the second transfer space T2.

For example, the width of each of the first and second substrate holding parts 161 and 162 is smaller than the diameter of the wafer W. The distal end portion and the proximal end portion of each of the first and second substrate holding parts 161 and 162 support rear surfaces of the wafers W in a mutually spaced-apart relationship. The wafers W are supported by the distal end portions of the first and second substrate holding parts 161 and 162 such that the central portions of the wafers W are supported by the distal ends of the first and second substrate holding parts 161 and 162, respectively.

With this configuration, in cooperation between the substrate transfer mechanism 15, the delivery pins 25 and the mounting table 22, for example, four wafers W are delivered simultaneously in a collective manner between the substrate transfer mechanism 15 and the mounting table 22. In FIG. 4, reference numeral 27 denotes a bearing part for holding the driving shaft 231 in a vertically-movable and rotatable manner while keeping the interior of the processing container 20 airtight.

Further, in the ceiling member 201 of the processing container 20, the gas supply part 4 serving as an upper electrode is provided above the mounting table 22 via a guide member 34 made of an insulating material. The gas supply part 4 includes a lid 42, a shower plate 43 having an facing surface formed so as to face the mounting surface of the mounting table 22, and a gas circulation chamber 44 formed between the lid 42 and the shower plate 43. A gas supply pipe 51 is connected to the lid 42. Gas discharge holes 45 are formed in the shower plate 43 so as to penetrate the shower plate 43 in the thickness direction while being arranged, for example, lengthwise and widthwise. Thus, gas is discharged toward the mounting table 22 in the form of a shower.

Each of the gas supply parts 4 is coupled to a gas supply system 50 via each gas supply pipe 51 (to be described later). The gas supply system 50 includes, for example, supply sources of a reaction gas (film-forming gas) used as a processing gas, a purge gas and a cleaning gas, pipes, valves V, flow rate regulators M and so on.

A high frequency power supply 41 is coupled to the shower plate 43 via a matching device 40. When high frequency power is applied between the shower plate (upper electrode) 43 and the mounting table (lower electrode) 22, a gas (reaction gas in this example) supplied from the shower plate 43 into the processing space S1 can be converted into plasma by capacitive-coupling.

Next, exhaust paths and a joined exhaust path formed in the intermediate wall portion 3 will be described. As shown in FIGS. 3 and 4, exhaust paths 31 respectively formed in the four processing spaces S1 to S4 and a joined exhaust path 32 in which the exhaust paths 31 are joined are formed in the intermediate wall portion 3. The joined exhaust path 32 extends in the vertical direction inside the intermediate wall portion 3.

In this embodiment, as shown in FIG. 4, the intermediate wall portion 3 is constituted by a wall body 311 provided at the side of the container body 202 and exhaust path forming members 312 provided at the side of the ceiling member 201. The exhaust paths 31 are formed inside the exhaust path forming member 312, respectively.

In addition, an exhaust port 33 is formed in a corresponding relationship with each of the processing spaces S1 to S4 in the wall surface of the intermediate wall portion 3 that is located outside each of the processing spaces S1 to S4. The exhaust paths 31 are formed in the intermediate wall portion 3 so as to connect the respective exhaust ports 33 and the joined exhaust path 32. Therefore, as shown in FIG. 4, for example, each of the exhaust paths 31 extends horizontally, is bent downward, extends vertically, and is connected to the joined exhaust path 32 inside the intermediate wall portion 3.

For example, each of the exhaust paths 31 has a circular-shaped section as shown in FIG. 3. A downstream end of each of the exhaust paths 31 is connected to an upstream end of the joined exhaust path 32. An upstream side of each of the exhaust paths 31 is opened as the exhaust port 33 outside the respective processing spaces S1 to S4.

A guide member 34 for performing exhaust is provided around each of the processing spaces S1 to S4 so as to surround each of the processing spaces S1 to S4. The guide member 34 is, for example, an annular body provided so as to surround the peripheral area of the mounting table 22 located at the processing position, in a spaced-apart relationship with the mounting table 22. The guide member 34 has, for example, a rectangular longitudinal inner section and is configured to form an annular flow path 35 when viewed from the top. In FIG. 3, the processing spaces S1 to S4, the guide members 34, the exhaust paths 31 and the joined exhaust path 32 are schematically shown.

As shown in FIG. 4, for example, the guide member 34 has a U-shaped longitudinal section that is opened downward. The guide member 34 is fitted into a recess 204 formed in the intermediate wall portion 3 and the sidewall portion 203 of the container body 202. The above-described flow path 35 is formed between the guide member 34 and members constituting the intermediate wall portion 3 and the sidewall portion 203.

Further, the guide member 34 fitted into the recess 204 of each of the intermediate wall portion 3 and the sidewall portion 203 forms a slit-shaped exhaust opening 36 opened toward each of the processing spaces S1 to S4. Thus, the slit-shaped exhaust opening 36 is formed circumferentially around the peripheral portion of each of the processing spaces S1 to S4. Further, the above-described exhaust port 33 is connected to the flow path 35 so that the processing gas exhausted from the slit-shaped exhaust opening 36 flows toward the exhaust port 33.

A set of two processing spaces S1 and S2 arranged along the extension direction of the first transfer space T1 and a set of two processing spaces S3 and S4 arranged along the extension direction of the second transfer space T2 will be described in detail. As shown in FIG. 3, the set of processing spaces S1 and S2 and the set of processing spaces S3 and S4 are arranged in a 180-degree rotationally symmetric manner around the joined exhaust path 32 when viewed from the top.

As a result, a processing gas circulation path that extends from each of the processing spaces S1 to S4 to the joined exhaust path 32 through the slit-shaped exhaust openings 36, the flow paths 35 of the guide members 34, the exhaust ports 33 and the exhaust paths 31 is formed in a 180-degree rotationally symmetric manner around the joined exhaust path 32. Focusing on only the processing gas circulation paths rather than the positional relationship between the processing gas circulation paths and the first and second transfer spaces T1 and T2 and the intermediate wall portion 3, it can also be said that the processing gas circulation paths are formed in a 90-degree rotationally symmetric manner around the joined exhaust path 32 when viewed from the top.

The joined exhaust path 32 is coupled to an exhaust pipe 61 via a joined exhaust opening 205 formed in the bottom surface of the processing container 20. The exhaust pipe 61 is coupled to a vacuum pump 62 constituting a vacuum exhaust mechanism via a valve mechanism 7. The vacuum pump 62 is provided for each processing container 20. For example, as shown in FIG. 1, the exhaust pipes 61 at the downstream sides of the vacuum pumps 62 are joined and are connected to, for example, a factory exhaust system.

The valve mechanism 7 is provided to open and close the processing gas flow path formed in the exhaust pipe 61 and includes, for example, a casing 71 and an opening/closing part 72. In this embodiment, a first opening 73 connected to the exhaust pipe 61 at the upstream side is formed in an upper surface of the casing 71, and a second opening 74 connected to the exhaust pipe 61 at the downstream side is formed in a lateral surface of the casing 71.

The opening/closing part 72 includes, for example, an opening/closing valve 721 formed to have such a size that closes the first opening 73, and an elevating mechanism 722 provided outside the casing 71 and configured to move up and down the opening/closing valve 721 inside the casing 71. Thus, the opening/closing valve 721 is configured to be raised/lowered between a closing position (indicated by a dash-dotted line in FIGS. 4 and 5) at which the opening/closing valve 721 closes the first opening 73 and an opening position (indicated by a solid line in FIGS. 4 and 5) at which the opening/closing valve 721 is withdrawn downward of the first and second openings 73 and 74. When the opening/closing valve 721 is located at the closing position, the downstream end of the joined exhaust opening 205 is closed such that the exhaust of gas from the processing container 20 is stopped. When the opening/closing valve 721 is located at the opening position, the downstream end of the joined exhaust opening 205 is opened such that the interior of the processing container 20 is exhausted.

Figure 5:
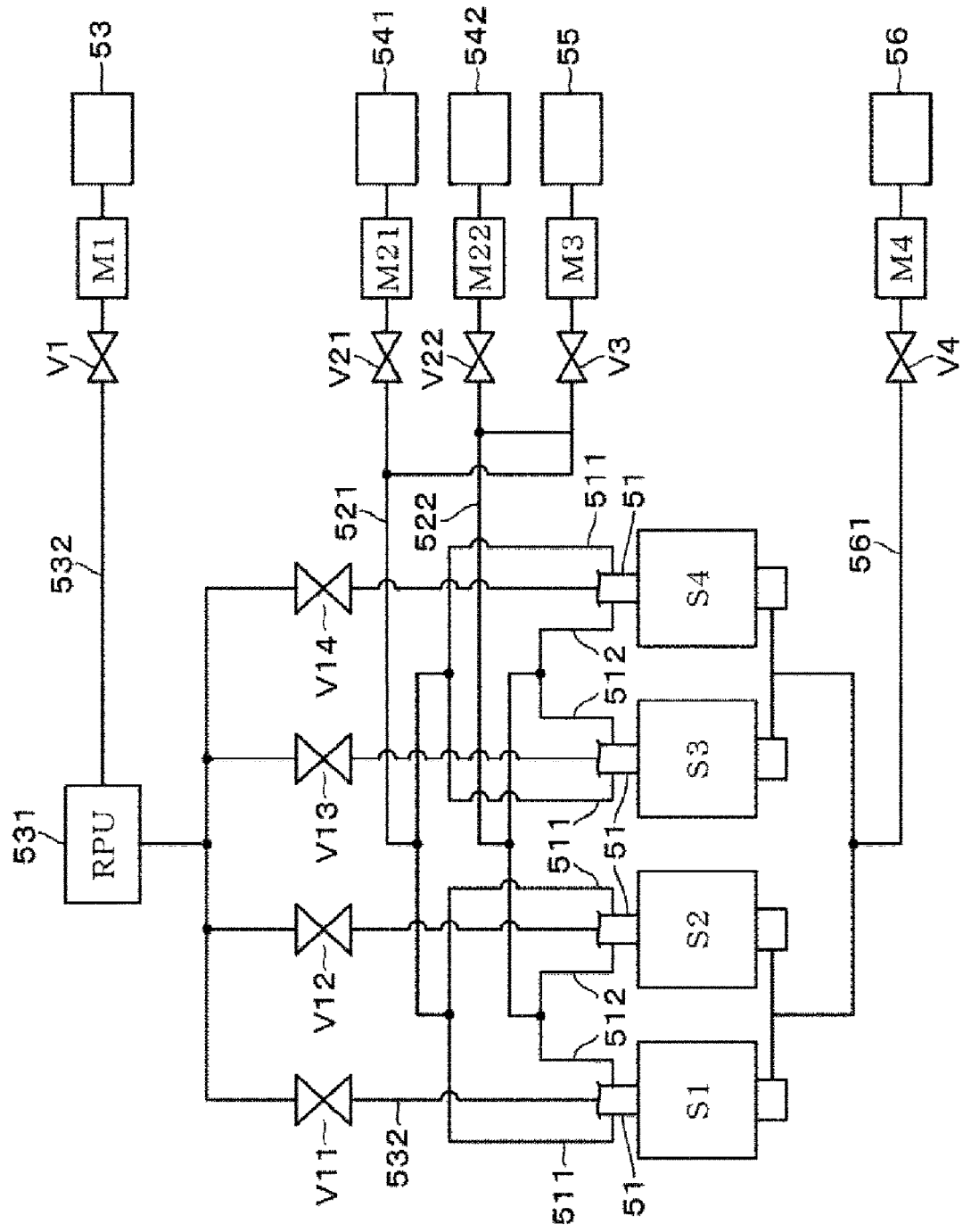
FIG. 5 is an explanatory view for explaining an example of a gas supply system of the vacuum processing apparatus.

Next, descriptions will be made on a processing gas supply system by taking as an example a case of using two types of reaction gases with reference to FIGS. 2 and 5. In FIG. 4, for the sake of convenience in illustration, a common single line of reaction gas supply system is shown (a gas distribution path 510 and a common gas supply line 52). The gas supply pipe 51 is connected to a substantial center of the upper surface of each of the gas supply parts 4. The gas supply pipe 51 is coupled to a first reaction gas supply source 541 and a purge gas supply source 55 via a sequence of a first gas distribution line 511 and a first common gas supply line 521. In addition, the gas supply pipe 51 is coupled to a second reaction gas supply source 542 and the purge gas supply source 55 via a sequence of a second gas distribution line 512 and a second common gas supply line 522. A valve V21 and a flow rate regulator M21 are used to supply a first reaction gas, a valve V22 and a flow rate regulator M22 are used to supply a second reaction gas, and a valve V3 and a flow rate regulator M3 are used to supply a purge gas.

Further, the gas supply pipe 51 is coupled to a cleaning gas supply source 53 via a sequence of a cleaning gas supply line 532 and a plasma unit (RPU: remote plasma unit) 531. At the downstream side of the plasma unit 531, the cleaning gas supply line 532 is branched into four lines that are connected to the respective gas supply pipes 51. A valve V1 and a flow rate regulator M1 are provided at the upstream side of the plasma unit 531 in the cleaning gas supply line 532. Valves V11 to V14 are respectively provided in the branched lines at the downstream side of the plasma unit 531. At the time of cleaning, the respective one of the valves V11 to V14 is opened. Taking as an example a case of forming an insulating oxide film ($SiO_2$) by CVD, a tetraethoxysilane (TEOS) gas or an oxygen ($O_2$) gas may be used as an example of the reaction gas, and an inert gas such as a nitrogen ($N_2$) gas or the like may be used as an example of the purge gas. When the TEOS gas and the $O_2$ gas are used as the reaction gas, for example, the TEOS gas is supplied from the first reaction gas supply source 541 and the $O_2$ gas is supplied from the second reaction gas supply source 542. An example of the cleaning gas may include a nitrogen trifluoride ($NF_3$) gas.

In this embodiment, in terms of the processing gas distributed from the common gas supply line 52, processing gas lines extending from the gas distribution lines 511 and 512 to the respective gas supply parts 4 are formed to be equal in conductance to one another. For example, as shown in FIGS. 2 and 5, the downstream side of the first common gas supply line 521 is branched into two lines. The two lines thus branched are further branched into two lines. Thus, the first gas distribution line 511 is arranged in a tournament manner.

The first gas distribution lines 511 are connected to the respective gas supply pipes 51 at the downstream side of the valves V11 to V14 for the cleaning gas. Further, the downstream side of the second common gas supply line 522 is branched into two lines. The two lines thus branched are further branched into two lines. Thus, the second gas distribution line 512 is arranged in tournament manner. The second gas distribution lines 512 are connected to the respective gas supply pipes 51 at the downstream side of the valves V11 to V14 for the cleaning gas.

In some embodiments, the first gas distribution lines 511 may be formed to have the same length and inner diameter throughout from the upstream end (end portion connected to the first common gas supply line 521) to the downstream end (end portion connected to the gas supply part 4 or the gas supply pipe 51). Further, in some embodiments, the second gas distribution lines 512 are formed to have the same length and inner diameter throughout from the upstream end (end portion connected to the second common gas supply line 522) to the downstream end. Thus, in terms of the processing gas distributed from the first common gas supply line 521, processing gas lines reaching the joined exhaust path 32 through the first gas distribution lines 511, the gas supply parts 4, the processing spaces S1 to S4 and the exhaust path 31 are formed to be equal in conductance to one another. Further, in terms of the processing gas distributed from the second common gas supply line 522, processing gas lines reaching the joined exhaust path 32 through the second gas distribution lines 512, the gas supply parts 4, the processing spaces S1 to S4 and the exhaust path 31 are formed to be equal in conductance to one another.

In a case of using a plurality of reaction gases, instead of the example described with reference to FIG. 5, the reaction gases may be merged beforehand in the gas supply system 50 and then supplied to the respective processing spaces S1 to S4. In such a case or in a case of using one type of reactive gas, as an actual piping configuration such as the common single line in the example of FIG. 4, the gas distribution paths 510 may be connected to the respective gas supply pipes 51. The gas distribution paths 510 are joined with the common gas supply line 52 and are connected to the gas supply system 50. In FIG. 4, reference numeral V2 denotes a reaction gas supply valve and reference numeral M2 denotes a flow rate regulator. Even in this case, in terms of the processing gas distributed from the common gas supply line 52, processing gas lines reaching the joined exhaust path 32 through the gas distribution paths 510, the gas supply parts 4, the processing spaces S1 to S4 and the exhaust path 31 are formed to be equal in conductance to one another. Further, as shown in FIG. 5, a purge gas for bottom purge may be supplied from a gas supply source 56 to each of the processing spaces S1 to S4 through a gas supply path 561 in which a valve V4 and a flow rate regulator M4 are installed.

The vacuum processing system 1 is provided with a control part composed of a computer. The control part includes, for example, a program, a memory, a data processor including a CPU, and the like. The program incorporates an instruction to send a control signal from the control part to each part of the vacuum processing system 1 so that each part executes a film forming process (to be described later). The program is stored in a storage medium such as a compact disk, a hard disk, a magneto-optical disk (MO) or the like and is installed on the control part.

Next, the transfer and processing of the wafer W in the vacuum processing system 1 will be briefly described. The wafers W in the carrier C placed on the loading/unloading port 11 are picked up by the transfer mechanism 120 in the loading/unloading module 12 under a normal pressure atmosphere, and are loaded into the load lock chamber 122. Subsequently, the interior of the load lock chamber 122 is switched from the normal pressure atmosphere to a vacuum atmosphere. Thereafter, the substrate transfer mechanism 15 of the vacuum transfer module 13 picks up the wafers W in the load lock chamber 122 and transfers the same to a predetermined vacuum processing apparatus 2 via the vacuum transfer chamber 14. As described above, the substrate transfer mechanism 15 holds a total of four wafers W using the first substrate holding part 161 and the second substrate holding part 162, each of which holds two wafers W.

The gate valve G of the vacuum processing apparatus 2 for processing the transferred wafers W is opened. The first and second substrate holding parts 161 and 162 simultaneously enter the first and second transfer spaces T1 and T2, respectively, and simultaneously deliver the wafers W on the respective delivery pins 25. Subsequently, the first and second substrate holding parts 161 and 162 are withdrawn from the vacuum processing apparatus 2, and the gate valve G is closed.

Thereafter, for example, the position of the opening/closing valve 721 of the valve mechanism 7 is controlled to set the internal atmosphere of the processing container 20 to a vacuum atmosphere of a predetermined pressure. Each mounting table 22 is moved up to the processing position to heat each wafer W by each heater 24. Subsequently, a reaction gas for film formation is supplied from each gas supply part 4 into the four processing spaces S1 to S4 in the processing container 20. Further, each high frequency power supply 41 is turned on to supply high frequency power between each gas supply part 4 and each mounting table 22. The gas supplied from each gas supply part 4 is converted into plasma to perform the film forming process. Thus, a film is formed on a front surface of each wafer W by the plasmarized reaction gas.

Figure 6:
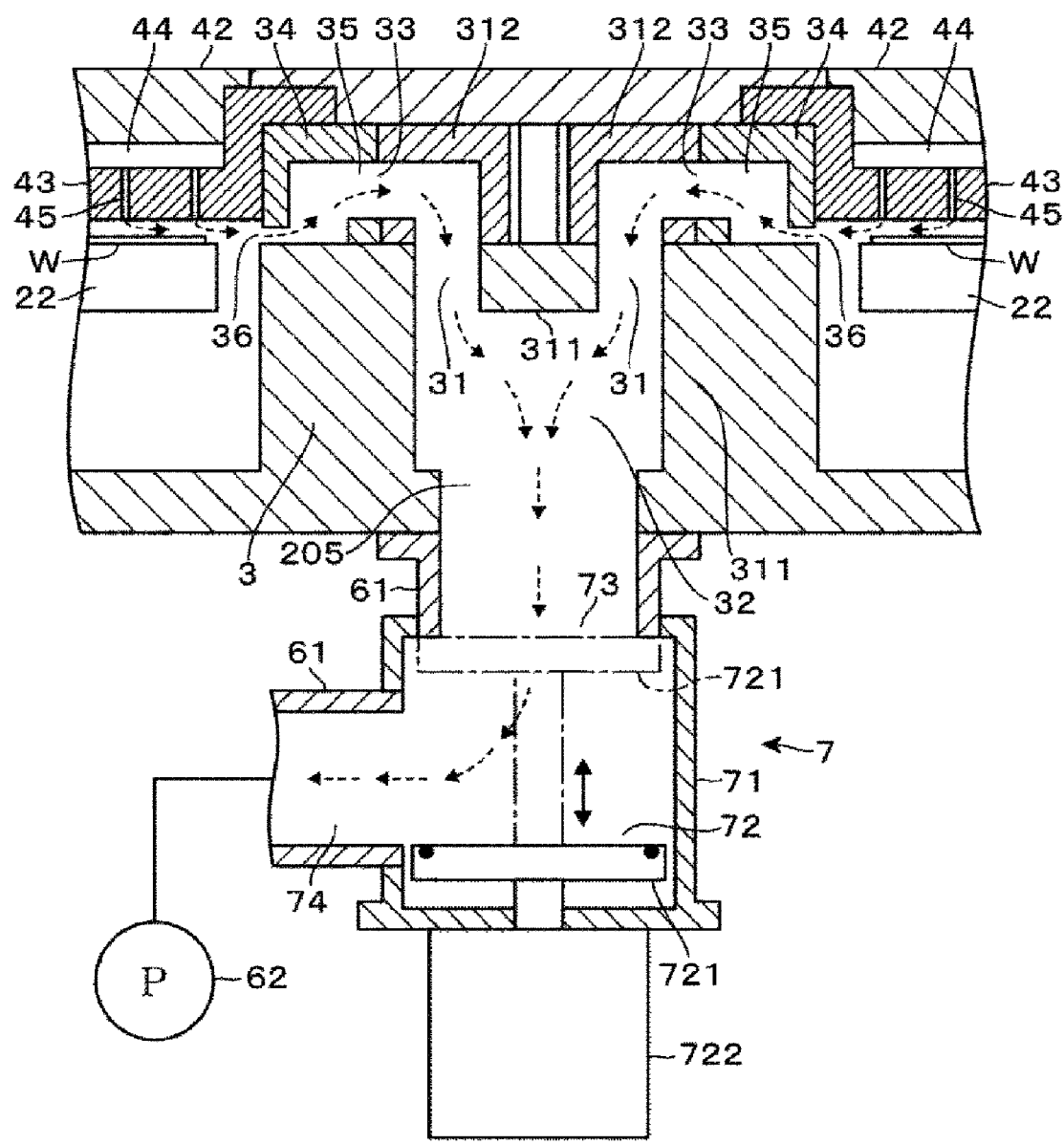
FIG. 6 is a partial longitudinal cross-sectional view for explaining the operation of the vacuum processing apparatus.

Next, a flow of the processing gas flowing into/out of each of the processing spaces S1 to S4 will be described with reference to FIGS. 4 and 6. The processing gases (reaction gases) supplied from the respective supply sources 541 and 542 are distributed and supplied into the gas circulation chamber 44 of the gas supply part 4 via the common gas supply lines 521 and 522 and the gas distribution lines 511 and 512, respectively. The processing gases flown into the gas circulation chamber 44 are mixed with each other in the gas circulation chamber 44. The mixture of the processing gases is discharged onto each wafer W mounted on each mounting table 2 via the shower plate 43 in the form of a shower.

On the other hand, the interior of the processing container 20 is exhausted via the joined exhaust path 32. Thus, the processing gas supplied into each of the processing spaces S1 to S4 is flown into each flow path 35 via the annular slit-shaped exhaust opening 36 formed around the peripheral portion of each of the processing spaces S1 to S4. The processing gas flown into each flow path 35 flows toward each exhaust port 33 formed in the central portion of the processing container 20. Then, each processing gas reaches the joined exhaust path 32 from each exhaust port 33 via each exhaust path 31 and is flown and discharged out of the processing container 20.

In this way, the processing gas flows outward of each of the processing spaces S1 to S4. Thus, the front surface of the wafer W mounted on each mounting table 22 is subjected to a film forming process uniform in the circumferential direction.

Further, in terms of the processing gases distributed from the gas supply lines 521 and 522, processing gas lines extending from the respective gas distribution lines 511 and 512 to the joined exhaust path 32 through the respective processing spaces S1 to S4 and the respective exhaust paths 31 are formed to be equal in conductance to one another. Therefore, it is confirmed by experiments and simulations that the supply state and the exhaust state of the gases from the gas supply parts 4 are uniform throughout the respective processing spaces S1 to S4. In terms of the wafers W mounted on the respective mounting tables 22, it is possible to make flow rates, supply timings and flowing manners of the processing gases uniform throughout the four processing spaces S1 to S4. As a result, the film forming process can be performed in the four processing spaces S1 to S4 under uniform conditions. Thus makes it possible to make the exhaust states of the processing spaces S1 to S4 uniform as a whole even if the exhaust processes of the processing spaces S1 to S4 are not individually controlled. This makes the degree of the film forming process uniform. As described above, it is unnecessary to individually control amounts of the gases exhausted from the processing spaces S1 to S4, which facilitates the control.

After the film forming process is performed for a predetermined period of time in this manner, the gate valve G of the processing container 20 is opened, the first and second substrate holding parts 161 and 162 enter the processing container 20 to receive the four wafers W in a simultaneous manner. Subsequently, the four wafers W held by the substrate transfer mechanism 15 are returned to the carrier C kept in the normal pressure atmosphere by the transfer mechanism 120 via the load lock chamber 122 of the loading/unloading module 12.

In some embodiments, in the vacuum processing apparatus 2, for example, a cleaning process may be performed after the above-described film forming process is performed a preset number of times. The cleaning process is performed by supplying a cleaning gas into each of the processing spaces S1 to S4 and turning on the plasma unit 531 to supply a plasmarized cleaning gas, while exhausting the interior of the processing container 20. The cleaning gas, for example, an $NF_3$ gas, is plasmarized with high frequency power in the plasma unit 531. The cleaning process is performed with fluorine radicals generated by the plasmarization. The cleaning gas is supplied into each of the processing spaces S1 to S4 through the respective gas supply parts 4 by opening the valves V11 to V14 respectively installed in four lines provided by equally dividing the downstream-side line of the plasma unit 531.

The cleaning gas reaches the joined exhaust path 32 from each of the processing spaces S1 to S4 through each slit-shaped exhaust opening 36, each flow path 35, each exhaust port 33 and each exhaust path 31, and flows out of the processing container 20. By supplying the cleaning gas in this way, foreign substances existing in the interior of the processing container 20 are removed and discharged out of the processing container 20 together with the cleaning gas.

According to the present embodiment, the intermediate wall portion 3 is formed between the first transfer space T1 and the second transfer space T2. The two processing spaces S1 and S2, and the two processing spaces S3 and S4 are arranged in the first transfer space T1 and the second transfer space T2, respectively. The exhaust paths 31 provided respectively for the four processing spaces S1 to S4 and the joined exhaust path 32 where the exhaust paths 31 are joined are formed in the intermediate wall portion 3. By providing the joined exhaust path 32 inside the processing container 20 to exhaust the four processing spaces S1 to S4, it is possible to simplify the vacuum processing apparatus 2. In addition, the joined exhaust path 32 is coupled to the vacuum pump 62 by the exhaust pipe 61. Thus, one exhaust pipe 61 is required. Therefore, a large maintenance space can be secured below the processing container 20, which improves maintainability. Further, the formation of the joined exhaust path 32 inside the processing container 20 prevents pipe arrangement from being complicated, as compared with the formation of the joined exhaust path 32 outside the processing container 20. This shortens the overall length of the exhaust paths, thereby improving the exhaust efficiency.

On the other hand, in a configuration, such as the one described in the Background section, in which a wafer transfer mechanism is provided inside a processing container that processes a plurality of wafers, it is difficult to provide an exhaust port in the central portion of the processing container. Therefore, the exhaust of gas from the processing container has to be performed through the periphery of the processing container. For example, in a comparative technique, exhaust paths are respectively formed at four locations in the periphery of the processing container to correspond respectively to four processing spaces of the processing container. For this reason, a joined exhaust path where the four exhaust paths are joined is provided below the processing container. This increases the apparatus in size. In addition, the arrangement of an exhaust pipe below the processing container may become complicated and a plurality of valves may be required. Therefore, a limited maintenance space may be provided below the processing container, which hinders the maintenance work.

In addition, the four processing spaces S1 to S4 arranged in the first and second transfer spaces T1 and T2 are arranged in a 180-degree rotationally symmetric manner around the joined exhaust path 32 when viewed from the top. Thus, the processing spaces S1 to S4 are arranged around the joined exhaust path 32, which facilitates the design for reducing the size of the processing container 20. Further, the joined exhaust path 32 and the processing spaces S1 to S4 can share the same configuration, which makes the exhaust states of the four processing spaces S1 to S4 uniform.

Furthermore, the joined exhaust path 32 is formed to extend vertically inside the intermediate wall portion 3. This makes it possible to reduce the formation space of the joined exhaust path 32 in a plan view, which contributes to the miniaturization of the vacuum processing device 2.

In some embodiments, one or more processing spaces may be arranged in the first transfer space T1 of the processing container 20 along the extension direction, and two or more processing spaces may be arranged in the second transfer space T2 along the extension direction. FIG. 7A shows an example in which one processing space S11 is arranged in the first transfer space T1 along the extension direction (X'-direction in FIG. 7A) and two processing spaces S12 and S13 are arranged in the second transfer space T2 along the extension direction. Exhaust paths 31 provided respectively for the three processing spaces S11 to S13 and a joined exhaust path 32 where the exhaust paths 31 are joined, are formed in the intermediate wall portion 3.

FIG. 7B shows an example in which three processing spaces S21 to S23 are arranged in the first transfer space T1 along the extension direction, and three processing spaces S24 to S26 are arranged in the second transfer space T2 along the extension direction. Exhaust paths 31 provided respectively for the six processing spaces S21 to S26 and a joined exhaust path 32 where the exhaust paths 31 are joined are formed in the intermediate wall portion 3.

Further, as shown in FIG. 7C, a plurality of (for example, two) joined exhaust paths 32 may be arranged in the intermediate wall portion 3 inside the processing container 20 in the extension direction. In this example, four processing spaces S31 to S34 are arranged in the first transfer space T1 along the extension direction, and four processing spaces S35 to S38 are arranged in the second transfer space T2 along the extension direction. In addition, front-side exhaust paths 31 provided respectively for the four processing spaces S31, S32, S35 and S36 in the front side of the extension direction and a joined exhaust path 32 where the front-side exhaust paths 31 are joined, are formed in the intermediate wall portion 3. Further, rear-side exhaust paths 31 provided respectively for the four processing spaces S33, S34, S37 and S38 in the rear side of the extension direction and a joined exhaust path 32 where the rear-side exhaust paths 31 are joined, are formed in the intermediate wall portion 3.

Even in the configurations shown in FIGS. 7A to 7C, the exhaust paths 31 and the joined exhaust path(s) 32 are provided in the intermediate wall portion 3. It is therefore possible to reduce and simplify the vacuum processing apparatus 2 in size and configuration, and to improve maintainability.

In some embodiments, the vacuum process performed in the vacuum processing apparatus 2 is not limited to the film forming process based on CVD but may be a film forming process based on ALD (Atomic Layer Deposition) or an etching process. The ALD-based film forming process includes stacking reaction products by repeating a cycle a multiple number of times. The cycle includes allowing a raw material gas to be adsorbed onto a wafer W, and causing the raw material gas adsorbed onto the wafer W to react with a reaction gas to generate the reaction products. In some embodiments, the number of the vacuum processing apparatuses 2 connected to the vacuum transfer chamber 14 in the vacuum processing system 1 may be one.

According to some embodiments of the present disclosure, it is advantageous to reduce and simplify a vacuum processing apparatus in size and configuration.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vacuum processing apparatus for performing a vacuum process by supplying a processing gas onto a substrate arranged in a processing space kept in a vacuum atmosphere, the apparatus comprising:
a first transfer space and a second transfer space in each of which the substrate is transferred, the first transfer space and the second transfer space being provided at adjacent positions inside a processing container in which the vacuum process is performed, each of the first transfer space and the second transfer space being provided to extend horizontally from a leading/unloading port formed in a side surface of the processing container; and
an intermediate wall portion provided between the first transfer space and the second transfer space along the extension direction,
wherein one or more processing spaces are arranged in the first transfer space along the extension direction, and two or more processing spaces are arranged in the second transfer space along the extension direction, and
wherein a plurality of exhaust paths, which are provided respectively for three or more processing spaces with the intermediate wall portion interposed therebetween, and a joined exhaust path where the plurality of exhaust paths are joined are formed in the intermediate wall portion.

2. The vacuum processing apparatus of claim 1, wherein a first set of two processing spaces and a second set of two processing spaces are arranged in the first transfer space and the second transfer space, respectively, and
wherein the first set of two processing spaces and the second set of two processing spaces are arranged in a 180-degree rotationally symmetric manner around the joined exhaust path in a plan view.

3. The vacuum processing apparatus of claim 1, wherein the joined exhaust path is provided to extend in a vertical direction, and each of the plurality of exhaust paths is provided to connect an exhaust port formed in the intermediate wall portion outside each of the processing spaces and the joined exhaust path.

4. The vacuum processing apparatus of claim 3, wherein a slit-shaped exhaust opening formed circumferentially around a peripheral portion of each of the processing spaces and a circulation path through which the processing gas exhausted from the slit-shaped exhaust opening toward the exhaust port are provided between each of the processing spaces and the exhaust port.

5. The vacuum processing apparatus of claim 1, wherein each of the processing spaces is formed between a mounting table on which the substrate is mounted and a gas supply part having a surface disposed to face the mounting table and configured to supply the processing gas into each of the processing spaces.

6. The vacuum processing apparatus of claim 5, further comprising: a gas distribution line through which the processing gas supplied from a common gas supply line is distributed to the gas supply part corresponding to each of the processing spaces,
wherein, in terms of the processing gas distributed from the common gas supply line, processing gas lines reaching the joined exhaust path through the gas distribution line, the gas supply part, each of the processing spaces and each of the plurality of exhaust paths are provided to be equal in conductance to one another.

7. A vacuum processing system comprising:
a vacuum transfer module including a vacuum transfer chamber and a substrate transfer mechanism that is arranged inside the vacuum transfer chamber and provided with a substrate holder for transferring at least one substrate;
at least one vacuum processing apparatus connected to the vacuum transfer chamber, wherein the substrate holder enters into a first transfer space and a second transfer space via a loading/unloading port to transfer the at least one substrate between the vacuum transfer chamber and least one of a plurality of processing spaces;
a loading/unloading port on which a transfer container configured to accommodate the at least one substrate to be processed is placed; and a loading/unloading module configured to transfer the at least one substrate between the transfer container and the vacuum transfer module, wherein each of the at least one vacuum processing apparatus is configured to perform a vacuum process by supplying a processing gas onto the at least one substrate arranged in the plurality of processing spaces kept in a vacuum atmosphere, wherein each of the at least one vacuum processing apparatus comprises:

the first transfer space and the second transfer space in each of which the at least one substrate is transferred, the first transfer space and the second transfer space being provided, at adjacent positions inside a processing container in which the vacuum process is performed, each of the first transfer space and the second transfer space being provided to extend horizontally from the loading/unloading, port formed in a side surface of the processing container; and an intermediate wall portion provided between the first transfer space and the second transfer space along an extension direction, and wherein one or ore processing spaces among the plurality of processing spaces are arranged in the first transfer space along the extension direction, and two or more processing spaces among the plurality of processing spaces are arranged in the second transfer space along the extension direction.

8. The vacuum processing system of claim 7, wherein the substrate transfer mechanism includes a first substrate holding part and a second substrate holding part, the at least one substrate includes a first set of substrates and a second set of substrates, and the plurality of processing spaces includes a first set of processing spaces and a second set of processing spaces, wherein the first substrate holding part is configured to hold the first set of substrates such that the first set of substrates is located at positions corresponding to arrangement positions of the first set of processing spaces in the first transfer space when the substrate transfer mechanism enters into the first transfer space, and the second substrate holding part is configured to hold the second set of substrates such that the second set of substrates is located at positions corresponding to arrangement positions of the second set of processing spaces in the second transfer space when the substrate transfer mechanism enters into the second transfer space.

9. The vacuum processing system of claim 8, wherein the substrate transfer mechanism is configured to simultaneously enter the first substrate holding part and the second substrate holding part into the first transfer space and the second transfer space, respectively.

10. A vacuum processing method of performing a vacuum process by supplying a processing gas onto at least one substrate arranged in at least one of a plurality of processing spaces kept in a vacuum atmosphere, the method comprising:

loading the at least one substrate into a processing container such that the at least one substrate is accommodated in the at least one of the plurality of processing spaces, respectively, wherein the processing container includes a first transfer space and a second transfer space in each of which the at least one substrate is transferred, and an intermediate wall portion provided between the first transfer space and the second transfer space, the first transfer space and the second transfer space being provided at adjacent positions inside the processing container in which the vacuum process is performed, each of the first transfer space and the second transfer space being provided to extend horizontally from a loading/unloading port formed in a side surface of the processing container; the intermediate wall portion being provided parallel to the extension direction, one or more processing spaces among the plurality of processing spaces being arranged in the first transfer space along the extension direction, and two or more processing spaces among the plurality of processing spaces being arranged in the second transfer space along the extension direction;

supplying the processing gas into each of the plurality of processing spaces in which the at least one substrate is accommodated; and exhausting the processing gas supplied into each of the plurality of processing spaces by using a plurality of exhaust paths provided respectively for three or more processing spaces with the intermediate wall portion interposed therebetween, and a joined exhaust path where the plurality of exhaust paths are joined and the plurality of exhaust paths and the joined exhaust path are formed in the intermediate wall portion.

* * * * *